United States Patent [19]

Kosaki

[11] Patent Number: 5,200,641
[45] Date of Patent: Apr. 6, 1993

[54] SEMICONDUCTOR DEVICE STRUCTURE INCLUDING BENDING-RESISTANT RADIATING LAYER

[75] Inventor: Katsuya Kosaki, Itami, Japan

[73] Assignee: Mitsubishi Denki Kabushiki Kaisha, Tokyo, Japan

[21] Appl. No.: 724,788

[22] Filed: Jul. 2, 1991

[30] Foreign Application Priority Data

Oct. 4, 1990 [JP] Japan ................... 2-268882

[51] Int. Cl.[5] ................ H01L 23/02; H01L 39/02
[52] U.S. Cl. ................... 257/720; 257/703; 361/386; 361/388
[58] Field of Search .............. 357/80, 81; 361/386, 361/388

[56] References Cited

U.S. PATENT DOCUMENTS

| | | | |
|---|---|---|---|
| 3,986,196 | 10/1976 | Decker et al. | 357/22 |
| 4,025,997 | 5/1977 | Gernitis et al. | 428/621 |
| 4,835,598 | 5/1989 | Higuchi et al. | 357/72 |
| 4,893,174 | 1/1990 | Yamada et al. | 357/82 |
| 4,910,583 | 3/1990 | Behr et al. | 357/81 |
| 4,941,067 | 7/1990 | Craft | 361/386 |
| 4,965,659 | 10/1990 | Sasame et al. | 357/81 |
| 4,994,903 | 2/1991 | Wroe et al. | 357/81 |
| 5,012,387 | 4/1991 | Ohlenburger | 361/388 |

FOREIGN PATENT DOCUMENTS

| | | |
|---|---|---|
| 0166633 | 1/1986 | European Pat. Off. . |
| 0424858 | 5/1991 | European Pat. Off. . |
| 3221199 | 1/1983 | Fed. Rep. of Germany . |
| 3314996 | 10/1983 | Fed. Rep. of Germany . |
| 2546878 | 12/1984 | France . |
| 2624654 | 6/1989 | France . |
| 58-135658 | 8/1983 | Japan . |
| 59-61052 | 4/1984 | Japan . |
| 59-135737 | 8/1984 | Japan . |
| 61-23350 | 1/1986 | Japan . |
| 63-80555 | 4/1988 | Japan . |
| 63-133555 | 6/1988 | Japan . |
| 1-109754 | 4/1989 | Japan . |
| 1-120853 | 5/1989 | Japan . |
| 1-258448 | 10/1989 | Japan . |
| 2213638 | 8/1989 | United Kingdom . |

OTHER PUBLICATIONS

Ronkese, "Metal Wool and Indium Heat Sink", IBM Technical Disclosure Bulletin, vol. 21, No. 3, 1989, pp. 1143–1144.
"Thermal Sponge", IBM Technical Disclosure Bulletin, vol. 29, No. 11, 1987, pp. 4950–4951.
"High Efficiency Radiation Hole With Metal Core Printed Wiring Board", IBM Technical Disclosure Bulletin, vol. 33, No. 7, 1990, pp. 48–51.

Primary Examiner—Rolf Hille
Assistant Examiner—David Ostrowski
Attorney, Agent, or Firm—Leydig, Voit & Mayer

[57] ABSTRACT

A high frequency and high power semiconductor device includes a semiconductor substrate having an active element on the front surface and a radiating metal layer for radiating heat generated by the active element on the rear surface of the substrate. The radiating metal layer is disposed on a part of the rear surface of the substrate directly opposite the active element. Further, a dispersion layer having a linear expansion coefficient equal to that of the substrate material and differing from that of the radiating metal layer is disposed on the rear surface of said semiconductor substrate but not directly opposite the active element.

17 Claims, 4 Drawing Sheets

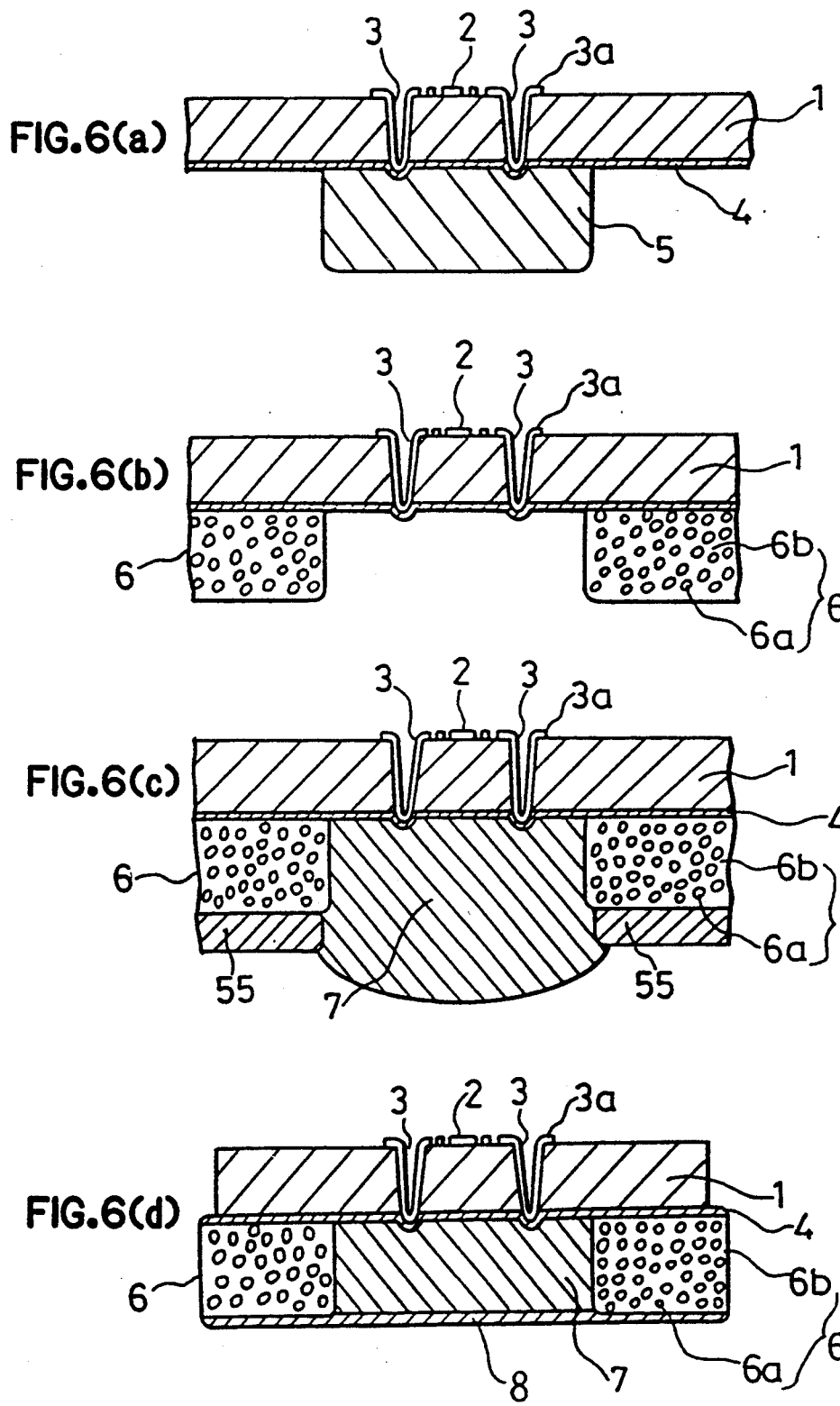

𝛿 : curvature
ℓ : length of longer side of chip

SEMICONDUCTOR DEVICE STRUCTURE INCLUDING BENDING-RESISTANT RADIATING LAYER

FIELD OF THE INVENTION

The present invention relates to a semiconductor device and a production method therefor and, more particularly, to a high-frequency and high power GaAs IC having a plated heat sink and a production method therefor.

BACKGROUND OF THE INVENTION

FIG. 7 is a cross-sectional view showing the construction of a prior art high-frequency and high power semiconductor device. The semiconductor device starts with a GaAs semiconductor substrate 1. Elements 2 such as FETs are produced in the surface of the substrate 1. Via-holes 3 are produced through the substrate so as to electrically connect the front surface and the rear surface of the substrate 1. A metal layer 3a comprising such as Au is produced at the wall surface of the via-hole 3. The rear surface of the substrate 1 is fixed onto a plated heat sink (PHS) 7 comprising Au for such as radiation of heat. Curvature of the chip is indicated by $\delta$ and the length of the longer edge of the curved chip is indicated by l.

The semiconductor device is fabricated as follows.

First of all, elements 2, such as FETs are produced at the surface of a semiconductor substrate 1 and via-holes 3 are also produced through the substrate 1. Thereafter, the semiconductor substrate 1 is polished at its rear surface until the thickness of substrate 1 is about 30 microns, so that the metal layer 3a in the via-hole 3 is exposed its bottom. A PHS 7 of about 40 microns thickness is produced at the rear surface side of substrate 1 by Au electroplating. Thereafter, the substrate 1 and the PHS 7 are cut by a dicer or etching and high-frequency and high power semiconductor chips are obtained as semiconductor devices.

In such a semiconductor device, the PHS 7 radiates heat generated at the active semiconductor element 2 such as an FET which is produced at the surface of semiconductor substrate 1. The PHS 7 also reinforces the thin semiconductor substrate 1 thereby to ease the handling of the chip. In this semiconductor device, however, curvature of chip arises due to the difference between the linear thermal expansion coefficients of the materials, i.e. the substrate 1 and the Au PHS 7.

In an example where the substrate 1 is a GaAs layer about 30 microns thick and the PHS 7 is an Au layer about 40 microns thick when the following bimetal formula is used with a die-bonding temperature of 300° C., the curvature $\delta$ and the length of chip longer edge l are in a relation shown in FIG. 8, where the curvature $\delta$ significantly increases with the increased length of chip longer edge l.

$$\frac{1}{R} = \frac{6(1+m)^2(\alpha_2 - \alpha_1)}{3(1+m)^2 + (1+mn)(m^2 + 1/mn)} \cdot \frac{\Delta T}{h}$$

here, $\alpha_1$: linear thermal expansion coefficient of GaAs ($6 \times 10^{-6}$[deg$^{-1}$])

$\alpha_2$: linear thermal expansion coefficient of Au ($14 \times 10^{-6}$[deg$^{-1}$])

$E_1$: Young's modulus of GaAs ($8.55 \times 10^{11}$)

$E_2$: Young's modulus of Au ($7.8 \times 10^{10}$)

$\Delta T$: temperature change (300° C. $-25°$ C. $=275$ deg)

And the curvature $\delta$ is calculated by the formula as follows.

$\delta = R(1 - \cos\theta)$
$\theta = \tan^{-1}(L/2R)$

More concretely, when the length of the chip longer edge l is larger than 2.5 mm in the prior art semiconductor device with the above-described conditions die-bonding and wire-bonding are difficult when mounting the chip onto a chip carrier and as the contact area between the chip and the chip carrier is largely reduced. This significantly deteriorates the heat radiating characteristics, resulting in undesired RF characteristics.

As a measure for preventing such curvature of a chip, Japanese Published Patent Application 61-23350 discloses a structure in which a hollow part is produced at the rear surface of a semiconductor substrate so that the semiconductor substrate directly opposite an active region is thinner than the periphery thereof and a metal fills this hollow part. In this case, however, the radiating region at the rear surface side of the substrate is narrowed and the radiating effect is significantly reduced.

SUMMARY OF THE INVENTION

It is an object of the present invention to provide a high-frequency and high power semiconductor device that prevents curvature of a chip and has no deterioration in the heat radiation characteristic even when the chip size is increased.

It is another object of the present invention to provide a method for manufacturing such a semiconductor device.

Other objects and advantages of the present invention will become apparent from the detailed description given hereinafter, it should be understood, however, that the detailed description and specific embodiment are given by way of illustration only, since various changes and modifications within the spirit and scope of the invention will become apparent to those skilled in the art from this detailed description.

A semiconductor device according to the present invention includes a heat radiating metal layer for radiating heat generated by an active semiconductor element at the front of a semiconductor substrate which is disposed only at a part of the rear surface of the semiconductor substrate directly opposite the active element Dispersion layers containing a metal and having a linear expansion coefficient equal to that of the substrate material and different from that of the heat radiating metal layer are disposed at parts of the semiconductor substrate other than the directly opposite the active element.

A method of manufacturing a semiconductor device according to the present invention includes a plating process for producing the heat radiating metal layer at the rear surface side of the semiconductor substrate. This plating process comprises selectively producing photoresist directly opposite the active element on the rear surface of the semiconductor substrate, producing a plated layer by plating selectively using the photoresist as a mask, removing the photoresist mask, burying the heat radiating metal layer opposite the active element by selective deposition of a dispersion and polishing the rear surface of the semiconductor substrate to flatten it.

BRIEF DESCRIPTION OF THE DRAWINGS

FIGS. 6(a)-6(d) are cross-sectional views showing a method of manufacturing the semiconductor device in accordance with the second embodiment of the present invention;

DETAILED DESCRIPTION OF THE PREFERRED EMBODIMENTS

Figure 1:
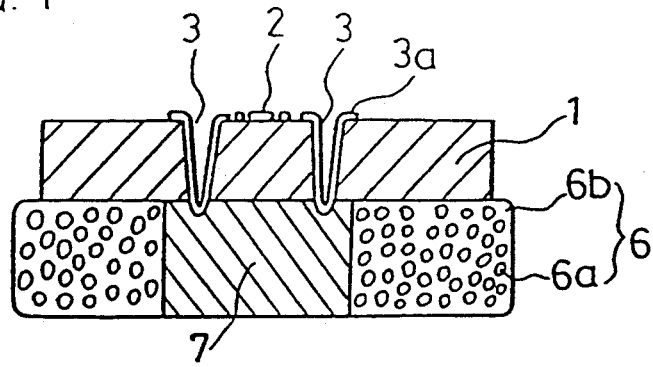
FIGS. 1-4 are cross-sectional views showing the construction of a high-frequency and high power semiconductor device in accordance with first to fourth embodiments of the present invention, respectively.
Figure 5A:
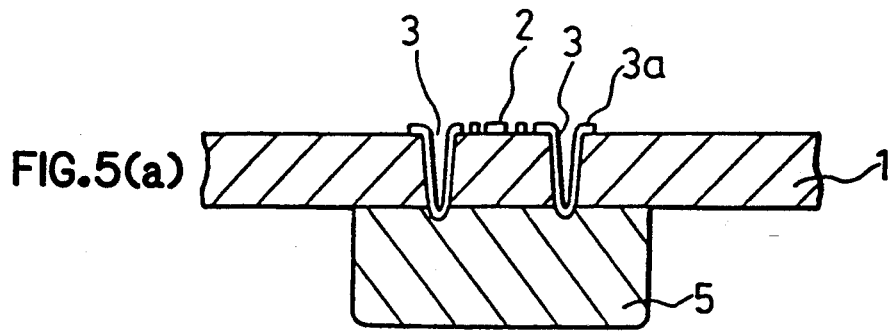
FIGS. 5(a)-5(d) are cross-sectional views showing a method of manufacturing the semiconductor device in accordance with the first embodiment.
Figure 7:
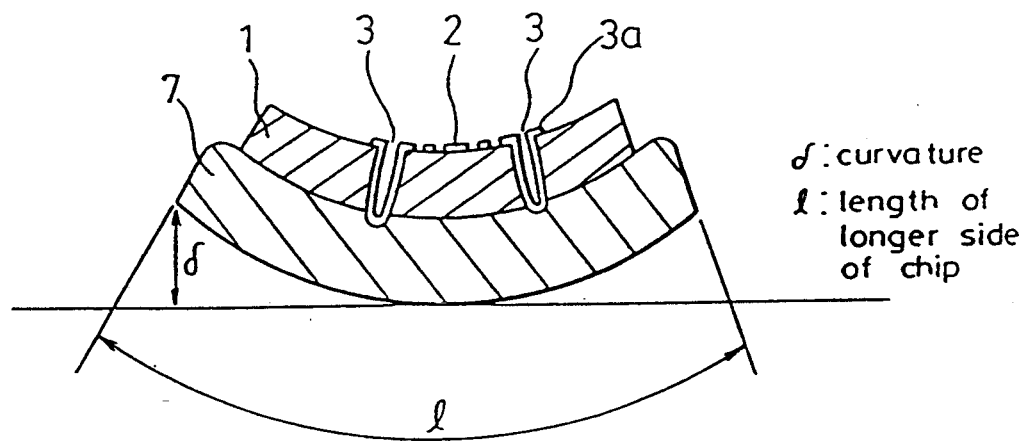
FIG. 7 is a cross-sectional view showing the construction of a prior art high-frequency and high power semiconductor device.
Figure 8:
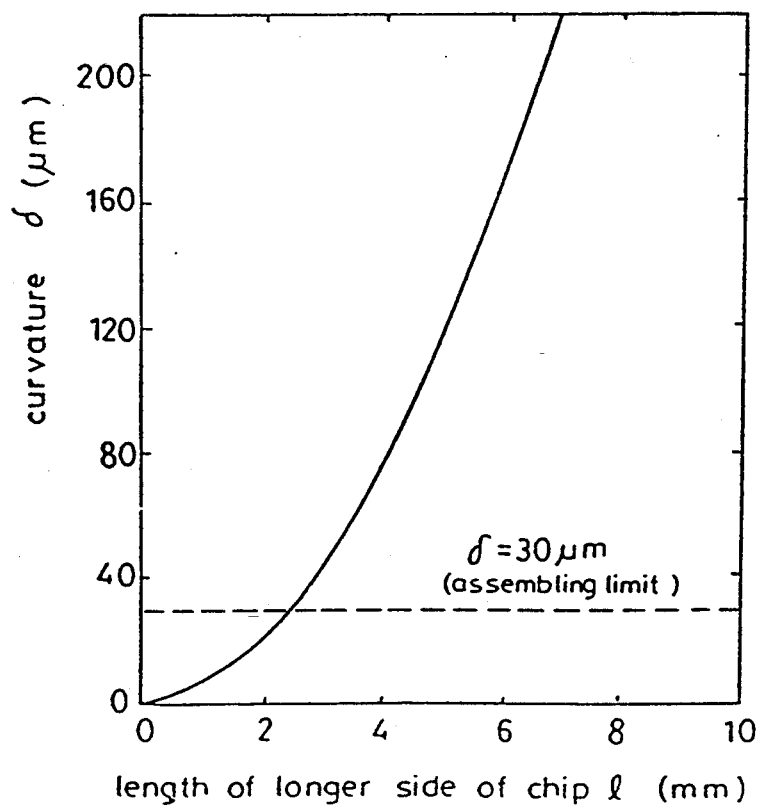
FIG. 8 is a diagram showing the relation between the curvature of a chip and length of the longer edge of a chip of a prior art high-frequency and high power semiconductor.

FIG. 1 is a cross-sectional view showing the construction of a high-frequency and high power semiconductor device in accordance with a first embodiment of the present invention. FIGS. 5(a)-5(d show cross-sectional views for explaining a method for manufacturing the device of FIG. 1. In FIGS. 1 and 5(a)-5(d), the same elements already described with respect to FIG. 7 are given the same reference numbers and are not described again. Unlike the prior art device, the device of FIG. 1 includes an Au PHS 7 only directly opposite the active semiconductor element on the rear surface of the semiconductor substrate 1. A dispersion layer 6 having a linear thermal expansion coefficient equal to that of the substrate material and different from that of the Au PHS 7 is produced on the rear surface the semiconductor substrate other than directly opposite the active element. The layer 6 includes a dispersion medium 6a comprising such as Si or C and metal 6b comprising such as Au dispersed in the medium in a composition ratio of about 7:3 to 4:1.

A description is given of a method for manufacturing the device of FIG. 1.

An active semiconductor element 2 comprising such as an FET is produced at a predetermined region of the front surface of a semiconductor substrate 1 and via-holes 3 are produced in the vicinity thereof. A metal layer 3a is produced by such as plating in the via-holes 3 and thereafter the semiconductor substrate is polished at its rear surface until the thickness of substrate is about 30 microns, so that the bottom surface of the layer 3a in the via-hole 3 is exposed to the rear surface of the GaAs substrate 1. A photoresist layer 5 of about 40 microns thickness is selectively produced at a part of the rear surface of the substrate 1 directly opposite the active element 2 and the via-holes 3 (FIG. 5(a)).

Figure 5B:
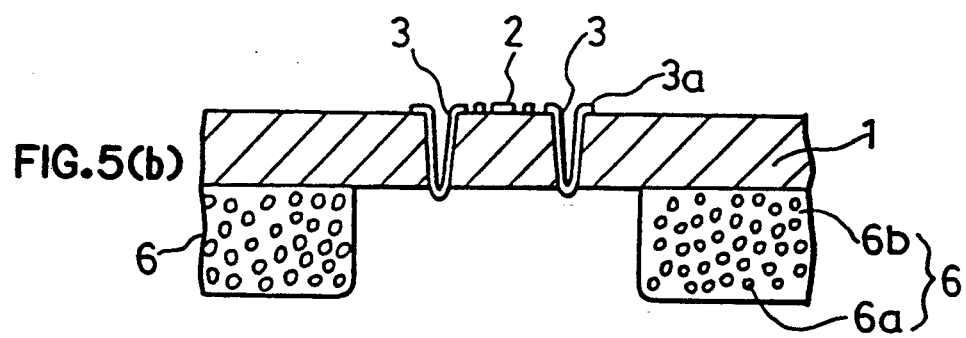

Next, Au-Si or Au-C dispersion layers 6 of about 40 microns thickness are produced at the rear surface of the substrate using the photoresist layer 5 as a mask and thereafter the photoresist layer 5 is removed (FIG. 5(b)). The dispersion is applied with the dispersion medium being dissolved in a solution and stirred. Thereby, a dispersion layer comprising the dispersion medium and the metal is produced.

Subsequently, second photoresist layers 55 are produced only on the dispersion layers 6 and using these as mask, an Au PHS layer of about 40 microns thickness is buried by selective electrolytic plating in a hollow part where the photoresist layer 5 is removed (FIG. 5(c)).

Figure 5C:
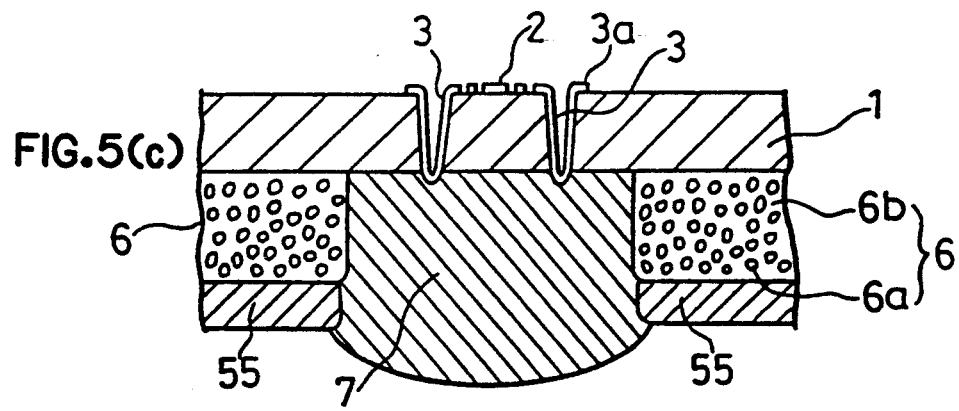
Figure 5D:
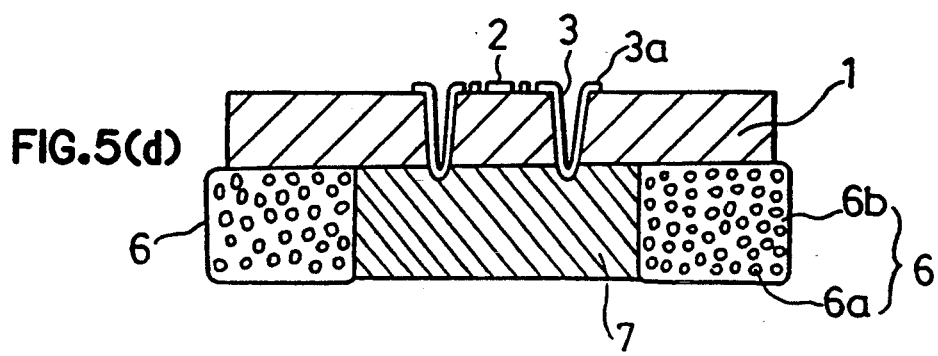

Thereafter, the second photoresist layers 55 are removed and the rear surface of the substrate 1 is again polished and flattened and thereafter a semiconductor device is obtained by scribing into semiconductor chips with a dicer or by etching (FIG. 5(d)).

In this embodiment, an Au PHS 7 is disposed only directly opposite the heat generating part of the chip at the rear surface of the semiconductor substrate 1, that is, directly opposite the active element 2 and the via-hole 3, and dispersion layers 6 including the dispersion medium 6a comprising Si or C and the metal 6b comprising Au in composition ratio of about 7:3 to 4:1 is provided so that thermal stress is not generated with the substrate. This structure relaxes the stress between the substrate 1 and the PHS 7 and reduces the curvature of the chip because the linear expansion coefficient at room temperature is 6 for GaAs, 14.2 for Au, 2.6 for Si and 3.1 for C. As a result, enlargement of the chip size is possible without adversely affecting the heat radiating characteristics.

Figure 2:
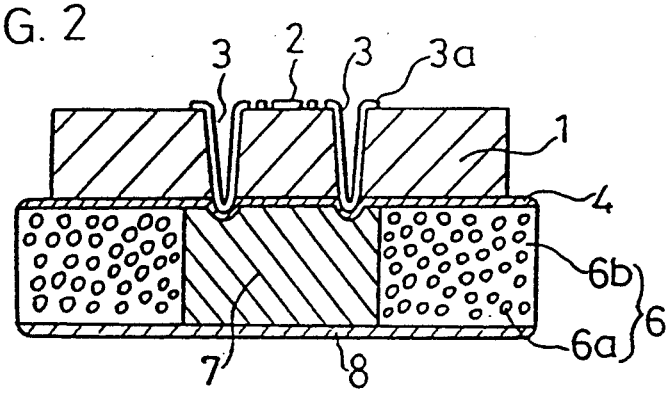

FIG. 2 shows a semiconductor device in accordance with a second embodiment of the present invention. In this second embodiment, the metal 6b comprises Ni (expansion coefficient 13.4), and the composition ratio between the dispersion medium 6a and the metal 6b is about 7:3. In this case, however, in order to reduce the conductor loss of a microstrip line on the GaAs substrate 1, a first Au layer 4 of about 1 to 2 microns thickness having a good electrical conductivity is disposed between the dispersion layer 6 and the rear surface of the GaAs substrate 1. Further, in order to enhance the adhesion with Au-Sn solder in the die bonding, a second Au layer 8 of about 1 to 2 microns thickness is disposed on the lower side surface of the dispersion layer 6.

A description is given of a production method.

An active element 2 such as an FET is produced at a predetermined region of front surface of the semiconductor substrate 1 and via-holes 3 are produced in the vicinity of the element 2. Thereafter, the semiconductor substrate is polished at its rear surface until the thickness of the substrate is about 30 microns, so that the bottom surface of the plating layer 3a in the via-hole part 3 is exposed to the outside. Subsequently a first Au layer 4 of about 1 to 2 microns thickness is plated. Thereafter, a photoresist layer 5 of about 40 microns thickness is selectively produced at the rear surface of the substrate directly opposite the element 2 and via-holes 3 (FIG. 6(a)).

Thereafter, similar to the process shown in FIG. 5(b) and 5(c) of the first embodiment, a dispersion layer 6 (FIG. 6(b)), and a photoresist layer 55 and Au PHS 7 (FIG. 6(c)) are produced. Here, the dispersion layer 6 comprises Ni-Si or Ni-C.

After removing the photoresist layer 55, the surface of the GaAs substrate 1 is polished and flattened, and thereafter a second Au layer 8 of about 1 to 2 microns thickness is produced. Dicer cutting or etching is carried out to produce semiconductor chips as shown in FIG. 2 (FIG. 6(d)).

Figure 3:
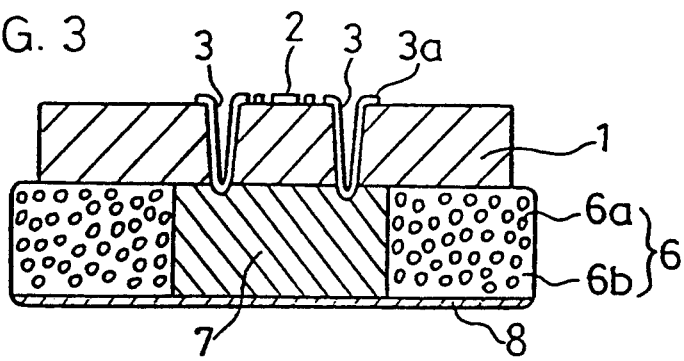

FIG. 3 shows a semiconductor device in accordance with a third embodiment of the present invention. This third embodiment is different from the second embodiment only in that the metal 6b comprises Cu (linear expansion coefficient 16.5) and that the composition ratio between the dispersion medium 6a and the metal 6b is about 4:1 to 5:1. In this third embodiment, because the electrical resistance of the dispersion layer 6 is smaller than that of the second embodiment, the first Au layer 4 for reducing the conductor loss of the microstrip line can be dispensed with.

In the production method of this third embodiment, the process for producing the first Au layer 4 is omitted from the process of FIG. 6(a).

Figure 4:
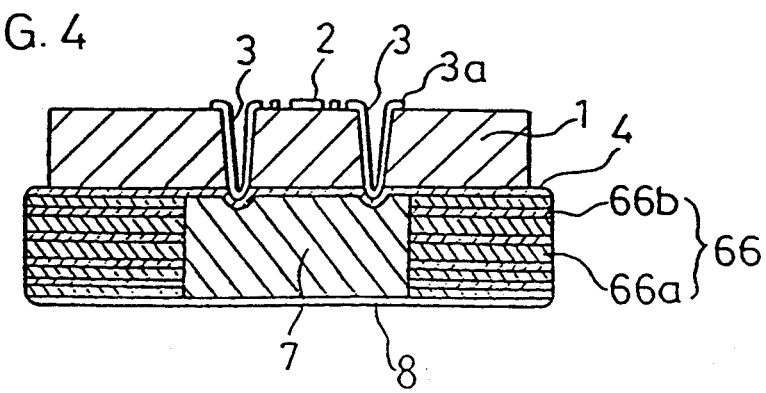

FIG. 4 shows a semiconductor device in accordance with a fourth embodiment of the present invention. This fourth embodiment is different from the second embodiment only in that the dispersion 6 is replaced by the laminated layer 66 comprising first and second metal films laminated, so that the stress generated with the substrate material 1 is mutually cancelled. Here, Mo (linear expansion coefficient 3.7) is used for the first metal film 66a, and Ni (linear expansion coefficient 13.4) is used for the second metal film 66b. W or WSi film can be used in place of Mo film.

In the production method of this fourth embodiment, the first and second metal layers are alternatively produced in the process of an FIG. 6(b).

In the above illustrated embodiment the burying of Au PHS is carried out by selective plating, but this can be carried out by P.R gilding (positive and negative reversed plating. This kind of plating is carried out by reversing the polarity of the applied voltage at predetermined times in an electrolytic plating process. The production of the metal layer by plating and the removal of the metal layer by dissolution are carried out alternatively. The dissolution is more difficult at a hollow part of the surface than at the flat portion. When burying of an Au PHS is carried out utilizing this effect, the mask of the photoresist layer 55 can be omitted.

In the above illustrated embodiment, Au is used to produce the PHS 7, but another metal or alloy having good thermal conductivity such as Cu may be used. Furthermore, a Si substrate, an InP substrate, or one in which a GaAs layer is epitaxially grown an Si substrate can be used in place of GaAs substrate. Furthermore, Si or C is used the dispersion medium in the foregoing example, but SiO, $SiO_2$, SiC, $Si_3N_4$, or diamond can also be used.

As is evident from the foregoing description, according to the present invention, a heat radiating metal layer which radiates the heat generated by the active element at the front surface of a semiconductor substrate is provided only at the rear surface of the substrate directly opposite the active element and a plated layer having a linear expansion coefficient equal to that of the substrate material and different from that of the heat radiating metal layer is provided on the rear surface of the semiconductor substrate but not directly opposite the active element. This structure relaxes the thermal stress between the semiconductor substrate and the heat radiating electrode (plated heat sink) at the rear surface thereby preventing the curvature of a chip and improves the heat radiation from the heating element. This enables realization of a large-sized chip having good characteristics.

What is claimed is:

1. A semiconductor device structure comprising:
   a semiconductor substrate having opposed front and rear surfaces, a linear thermal expansion coefficient, and an active semiconductor device disposed in said semiconductor substrate at a part of the front surface; and
   a radiating layer disposed on the rear surface of said semiconductor substrate for radiating heat generated by said active semiconductor device, said radiating layer including a metal portion disposed on a part of the rear surface of said semiconductor substrate that is directly opposite the part of the front surface of said semiconductor substrate on which said active semiconductor device is disposed and a composite portion disposed on the rear surface of said semiconductor substrate surrounding and contacting said metal portion, said composite portion including a metal dispersed in a dispersion medium in a concentration so that said composite portion has a linear thermal expansion coefficient substantially equal to that of said semiconductor substrate, said dispersion medium having a composition different from said metal.

2. A semiconductor device structure as defined in claim 1 wherein said semiconductor substrate is GaAs, said composite portion of said radiating layer comprises nickel dispersed in one of silicon and carbon.

3. A semiconductor device structure as defined in claim 1 wherein said semiconductor substrate is GaAs and said composite portion of said radiating layer comprises copper dispersed in one of silicon and carbon.

4. A semiconductor device structure as defined in claim 1 wherein said semiconductor substrate is GaAs and said composite portion of said radiating layer comprises gold dispersed in one of silicon and carbon.

5. A semiconductor device structure as defined in claim 1 wherein said metal portion has a linear thermal expansion coefficient that is different from the linear thermal expansion coefficient of said composite portion.

6. A semiconductor device structure as defined in claim 1 wherein said dispersion medium is selected from the group consisting of silicon, carbon, silicon oxide, silicon dioxide, silicon carbide, and silicon nitride.

7. A semiconductor device structure as defined in claim 1 wherein said metal dispersed in said dispersion medium is selected from the group consisting of copper, nickel, and gold.

8. A semiconductor device structure as defined in claim 1 including a metal layer interposed between and contacting said semiconductor substrate and said radiating layer.

9. A semiconductor device structure as defined in claim 8 wherein said metal layer is gold and has a thickness of about one to two microns., 10. A semiconductor device structure as defined in claim 1 including a metal layer disposed on said radiating layer opposite said semiconductor substrate.

11. A semiconductor device structure as defined in claim 10 wherein said metal layer is gold.

12. A semiconductor device structure comprising:
   a semiconductor substrate having opposed front and rear surfaces and an active semiconductor device disposed in said semiconductor substrate at a part of the front surface; and
   a radiating layer disposed on the rear surface of said semiconductor substrate for radiating heat generated by said active semiconductor device, said radiating layer including a metal portion disposed on a part of the rear surface of said semiconductor substrate that is directly opposite the part of the front surface of said semiconductor substrate on which said active semiconductor device is disposed and a laminated portion disposed on the rear surface of said semiconductor substrate surrounding and contacting said metal portion, said laminated portion including alternatingly laminated first and second metal films having different compositions for generating thermal expansion stresses in mutually opposite directions.

13. A semiconductor device structure as defined in claim 12 wherein said semiconductor substrate is GaAs, said first metal film is selected from the group consisting of molybdenum, tungsten, and tungsten silicide, and said second metal film comprises nickel.

14. A semiconductor device structure as defined in claim 12 including a metal layer interposed between and contacting said semiconductor substrate and said radiating layer.

15. A semiconductor device structure as defined in claim 14 wherein said metal layer is gold and has a thickness of about one to two microns.

16. A semiconductor device structure as defined in claim 12 including a metal layer disposed on said radiating layer opposite said semiconductor substrate.

17. A semiconductor device structure as defined in claim 16 wherein said metal layer is gold.

* * * * *